(12) United States Patent
Nakagawasai

(10) Patent No.: US 10,847,399 B2
(45) Date of Patent: Nov. 24, 2020

(54) MOVABLE STRUCTURE AND FILM FORMING APPARATUS

(71) Applicant: TOKYO ELECTRON LIMITED, Tokyo (JP)

(72) Inventor: Manabu Nakagawasai, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 224 days.

(21) Appl. No.: 15/947,400

(22) Filed: Apr. 6, 2018

(65) Prior Publication Data

US 2018/0294176 A1 Oct. 11, 2018

(30) Foreign Application Priority Data

Apr. 6, 2017 (JP) .................................. 2017-075868

(51) Int. Cl.
*H01L 21/683* (2006.01)
*H01L 21/677* (2006.01)
(Continued)

(52) U.S. Cl.
CPC ........ *H01L 21/6831* (2013.01); *C23C 14/358* (2013.01); *C23C 14/505* (2013.01); *C23C 14/54* (2013.01); *C23C 14/541* (2013.01); *C23C 16/4586* (2013.01); *C23C 16/463* (2013.01); *H01J 37/32036* (2013.01); *H01L 21/0262* (2013.01); *H01L 21/6719* (2013.01); *H01L 21/67098* (2013.01); *H01L 21/67248* (2013.01); *H01L 21/67739* (2013.01);
(Continued)

(58) Field of Classification Search
CPC ........... H01L 21/6831; H01L 21/68742; H01L 21/68764; H01L 21/68792; H01L 21/67109; H01L 21/6719; H01L 21/67098; H01L 21/0262; H01L 21/67248; H01L 21/67739; H01L 21/67103; H01J 37/32036; C23C 14/541; C23C 14/358; C23C 16/463; C23C 16/4586
See application file for complete search history.

(56) References Cited

U.S. PATENT DOCUMENTS

2002/0003037 A1* 1/2002 Cousineau ........... B23Q 11/126
165/278
2002/0139307 A1* 10/2002 Ryding ................. C23C 14/505
118/730

(Continued)

FOREIGN PATENT DOCUMENTS

JP    H5-6832         1/1993
JP    2007306449 A *  11/2007
(Continued)

*Primary Examiner* — Yuechuan Yu
(74) *Attorney, Agent, or Firm* — Fenwick & West LLP

(57) ABSTRACT

A movable structure includes a processing chamber configured to perform processing under a vacuum environment; a fixed portion disposed in the processing chamber; a movable portion that is movable with respect to the fixed portion; a transmission/reception module provided at the fixed portion and having a hermetically sealed structure; and a sensor module provided at the movable portion and having a hermetically sealed structure. The transmission/reception module and the sensor module perform transmission and reception of signals in a non-contact manner.

10 Claims, 3 Drawing Sheets

(51) Int. Cl.
   *H01L 21/67*      (2006.01)
   *C23C 14/35*      (2006.01)
   *H01J 37/32*      (2006.01)
   *C23C 16/46*      (2006.01)
   *H01L 21/02*      (2006.01)
   *C23C 16/458*     (2006.01)
   *C23C 14/50*      (2006.01)
   *H01L 21/687*     (2006.01)
   *C23C 14/54*      (2006.01)

(52) U.S. Cl.
   CPC .. *H01L 21/68742* (2013.01); *H01L 21/68764* (2013.01); *H01L 21/68792* (2013.01); *H01L 21/67103* (2013.01); *H01L 21/67109* (2013.01)

(56)              References Cited

U.S. PATENT DOCUMENTS

| 2004/0188021 | A1* | 9/2004  | Mitrovic  | H01L 21/67248 |
|              |     |         |           | 156/345.52    |
| 2013/0337635 | A1* | 12/2013 | Yamawaku  | H01L 21/02104 |
|              |     |         |           | 438/466       |
| 2016/0378092 | A1* | 12/2016 | Yamamoto  | G05B 19/404   |
|              |     |         |           | 700/300       |

FOREIGN PATENT DOCUMENTS

| JP | 2011020100 A     | * | 2/2011  |
| KR | 10-2014-0139359 A |   | 12/2014 |
| KR | 10-2016-0120233 A |   | 10/2016 |
| KR | 10-2016-0120339 A |   | 10/2016 |

* cited by examiner

MOVABLE STRUCTURE AND FILM FORMING APPARATUS

CROSS-REFERENCE TO RELATED APPLICATIONS

This application claims priority to Japanese Patent Application No. 2017-075868 filed on Apr. 6, 2017, the entire contents of which are incorporated herein by reference.

FIELD OF THE INVENTION

The present disclosure relates to a movable structure and a film forming apparatus.

BACKGROUND OF THE INVENTION

Conventionally, as a method for measuring the temperature of a rotating body, there is known a method in which a thermocouple is attached to a rotating body and a signal of the thermocouple is transmitted to a fixed body via a slip ring (see, e.g., Japanese Utility Model Application Laid-Open Publication No. H5-006832).

However, when the signal of the thermocouple is transmitted via the slip ring, if a temperature difference occurs between the rotating body and the fixed body, a measurement error occurs due to a difference in thermoelectromotive force. Therefore, it is difficult to accurately measure the temperature of the rotating body.

SUMMARY OF THE INVENTION

In view of the above, the present disclosure provides a movable structure capable of measuring a temperature of a rotating body with high accuracy.

In accordance with an aspect, there is provided a movable structure including: a processing chamber configured to perform processing under a vacuum environment; a fixed portion disposed in the processing chamber; a movable portion that is movable with respect to the fixed portion; a transmission/reception module provided at the fixed portion and having a hermetically sealed structure; and a sensor module provided at the movable portion and having a hermetically sealed structure, wherein the transmission/reception module and the sensor module perform transmission and reception of signals in a non-contact manner.

In accordance with another aspect, there is provided a film forming apparatus including: the movable structure described above; and a target provided in the processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
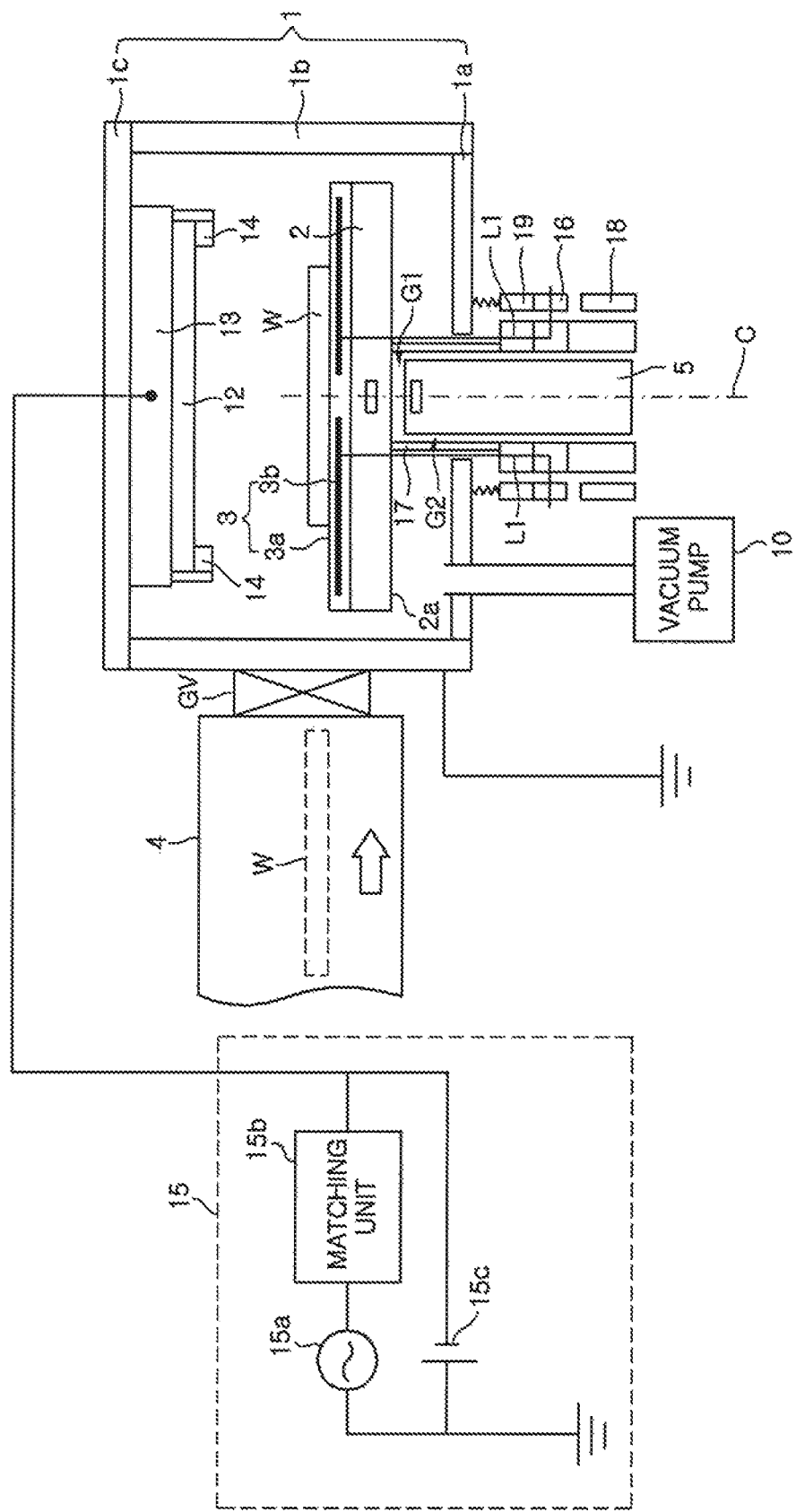
FIG. 1 is a schematic cross sectional view showing an example of a film forming apparatus according to an embodiment.

Hereinafter, embodiments will be described with reference to the accompanying drawings. Like reference numerals will be given to substantially like parts throughout this specification and the drawings, and redundant description thereof will be omitted.

First, a film forming apparatus to which a movable structure according to an embodiment can be applied will be described. Hereinafter, a PVD (Physical Vapor Deposition) apparatus will be described as an example of the film forming apparatus. The PVD apparatus can form a film on a substrate in a processing chamber capable of performing processing at a cryogenic temperature (e.g., 50 Kelvin (K) or less) and under an ultra-high vacuum environment (e.g., $10^{-9}$ Pa or less). The PVD apparatus may be suitable for formation of a magnetic film used for a reading head section of an HDD (Hard Disk Drive), a MRAM (Magnetoresistive Random Access Memory), or the like.

FIG. 1 is a schematic cross sectional view showing an example of a film forming apparatus according to an embodiment.

As shown in FIG. 1, the film forming apparatus includes a processing chamber 1. In the processing chamber 1, a rotatable mounting table 2 and an electrostatic chuck 3 fixed to the mounting table 2 are provided. A substrate W such as a semiconductor wafer or the like is mounted on the electrostatic chuck 3. The substrate W is transferred by a transfer mechanism (not shown) between the processing chamber 1 and a transfer chamber 4 that are connected to each other via a gate valve GV.

The processing chamber 1 includes: a bottom plate 1a provided at a bottom thereof; a cylindrical portion 1b surrounding an outer periphery of the bottom plate 1a; and a top plate 1c provided on the cylindrical portion 1b and configured to seal the cylindrical portion 1b. The bottom plate 1a and the cylindrical portion 1b may be formed as one unit. The cylindrical portion 1b and the top plate 1c may be formed as one unit.

A target holder 13 is fixed to the top plate 1c. A claw member 14 is fixed to the target holder 13. The target holder 13 holds the target 12 by sandwiching a peripheral portion of the target 12 between the target holder 13 and the claw member 14.

The target holder 13 is a conductor. An insulator is interposed between the target holder 13 and the top plate 1c. A plasma generation power supply 15 applies a voltage to the target holder 13. The processing chamber 1 including the top plate 1c is grounded and has a ground potential. The plasma generation power supply 15 applies a high-frequency potential to the target holder 13 and the target 12.

The plasma generation power supply 15 is used for generating a plasma in the processing chamber 1, ionizing a rare gas or the like, and sputtering the target 12 with an ionized rare gas element or the like. In order to generate a plasma, the processing chamber 1 is filled with a rare gas, such as argon (Ar), krypton (Kr) or neon (Ne), or a nitrogen ($N_2$) gas.

The plasma generation power supply 15 includes a high frequency AC power supply 15a and a matching unit 15b. The plasma generation power supply 15 applies an AC voltage to between the target 12 and the ground potential.

When the AC voltage is applied from the plasma generation power source 15 to the target 12, a plasma is generated near the target 12 and the target 12 is sputtered. The sputtered atoms or molecules are deposited on a surface of the substrate W facing the target 12. For example, when a magnetic film (containing a ferromagnetic material such as Ni, Fe, Co or the like) is deposited, CoFe, FeNi and NiFeCo may be used as a material for the target 12. Another element may be mixed with these materials for the target 12 as well.

The plasma generation power source 15 may further include a DC power supply 15c disposed in parallel with the AC power supply 15a. The DC power supply 15c can change the amplitude center of the potential applied to the target 12. Generally, a high frequency such as 13.56 MHz or the like is used for plasma generation. However, other frequencies may be used or a DC power supply may be used for plasma generation. It is also possible to perform magnetron sputtering by providing a magnet near the target 12 to apply a magnetic field to a surface of the target 12.

The electrostatic chuck 3 includes a dielectric film 3a and an electrode 3b. The electrode 3b is buried in the dielectric film 3a. The substrate W can be fixed to the electrostatic chuck 3 by applying a predetermined potential to the electrode 3b from a DC power supply (not shown) through a wiring L1. The wiring L1 and the DC power supply for supplying power to the wiring L1 are electrically connected via a slip ring 16. Accordingly, the wiring L1 can rotate together with the electrostatic chuck 3. A passage for supplying a cooling gas (heat transfer gas) such as helium (He) or the like can be formed at an interface between the electrostatic chuck 3 and the substrate W.

A vacuum pump 10 communicates with the processing chamber 1. By exhausting a gas in the processing chamber 1 by the vacuum pump 10, the pressure in the processing chamber 1 is reduced to a level at which a plasma can be generated. In other words, the processing chamber 1 is configured to perform processing under a vacuum environment.

A cooling mechanism 5 is provided below the mounting table 2 with a gap G1 between the cooling mechanism 5 and a bottom surface 2a of the mounting table 2. The mounting table 2 is cooled by the cooling mechanism 5 to a cryogenic temperature of 50 K or less, for example. Accordingly, the substrate W mounted on the mounting table 2 is also cooled to a cryogenic temperature of 50 K or less. In the case of forming a magnetic film by sputtering, thin film properties such as crystal grain size, film stress and the like can be controlled by performing the film formation at a cryogenic temperature.

A rotating unit 17 extending in a vertical direction is fixed on the bottom surface 2a of the mounting table 2 to surround an outer peripheral surface of the cooling mechanism 5 with a gap G2 therebetween. The rotating unit 17 is connected to a driving mechanism 18 such as a direct drive motor or the like. The driving mechanism 18 can rotate the rotating unit 17. Accordingly, the mounting table 2 fixed to the rotating unit 17 rotates about a central axis C of the mounting table 2. A magnetic fluid seal 19 is provided around the rotating unit 17, and the rotating unit 17 is configured to be rotatable while maintaining airtightness.

Figure 2:
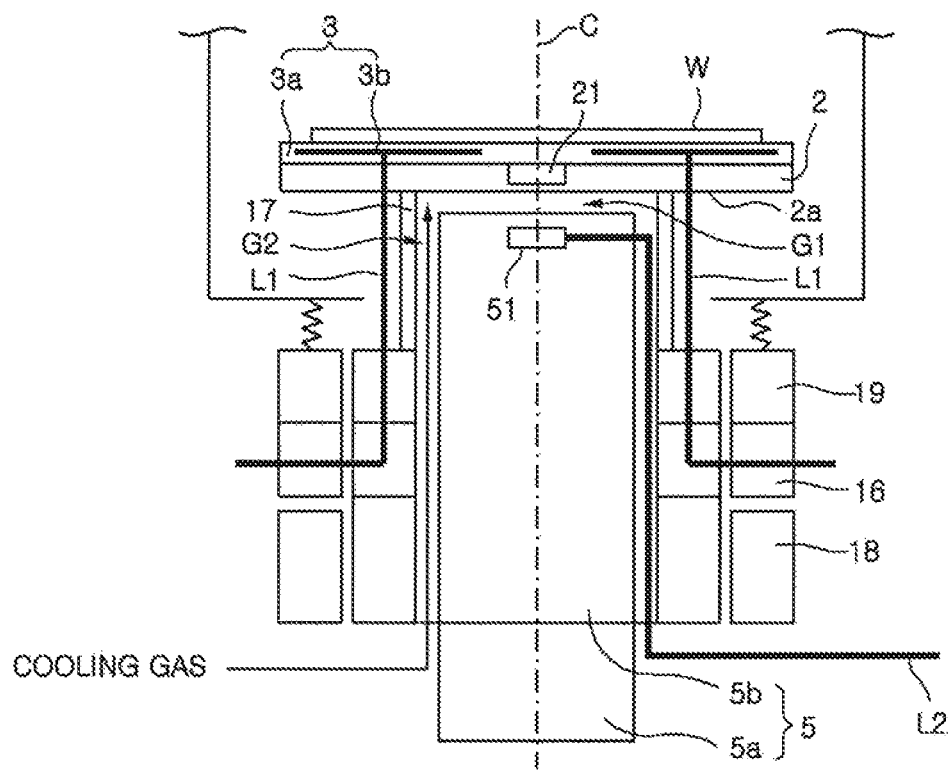
FIG. 2 is a schematic cross sectional view showing a first configuration example of a movable structure according to an embodiment.

Next, a first configuration example of the movable structure according to the embodiment will be described. FIG. 2 is a schematic cross sectional view showing the first configuration example of the movable structure according to the embodiment.

As shown in FIG. 2, the movable structure includes the processing chamber 1, the cooling mechanism 5, the mounting table 2, a transmission/reception module 51, and a sensor module 21.

The processing chamber 1 is configured to perform processing at a cryogenic temperature and under a vacuum environment.

The cooling mechanism 5 includes a freezer 5a and a freezing heat transfer member 5b. The freezing heat transfer member 5b is provided on the freezer 5a, and an upper portion thereof is disposed in the processing chamber 1. The freezing heat transfer member 5b is made of a material having a high thermal conductivity, e.g., copper (Cu) or the like, and has a substantially cylindrical shape. The freezing heat transfer member 5b is disposed such that a center thereof coincides with the central axis C of the mounting table 2. The gap G1 between the bottom surface 2a of the mounting table 2 and the upper surface of the freezing heat transfer member 5b functions as a cooling gas passage through which a cooling gas (heat transfer gas) such as He or the like is supplied. The freezer 5a cools the mounting table 2 by the freezing heat transfer member 5b and the cooling gas supplied to the cooling gas passage.

The mounting table 2 is rotatable with respect to the freezing heat transfer member 5b.

The transmission/reception module 51 is provided at the freezing heat transfer body 5b. A wiring L2 is connected to the transmission/reception module 51. Various signals such as a sensor signal, a power signal and the like are transmitted to and received from the outside of the processing chamber 1 through the wiring L2. The wiring L2 is drawn out from the transmission/reception module 51 to the outside via, e.g., a hermetic seal having an extremely fine wire diameter. The transmission/reception module 51 is configured to be able to transmit and receive various signals such as a sensor signal, a power signal and the like to and from the sensor module 21 in a non-contact (wireless) manner. The transmission/reception module 51 has a coil for transmitting and receiving various signals through high frequencies, resonance, microwaves, or the like. Specifically, the transmission/reception module 51 obtains a temperature measured by a temperature sensor 22 of the sensor module 21 in a non-contact manner via the coil. Further, the transmission/reception module 51 supplies a power signal to the sensor module 21 in a non-contact manner via the coil. The transmission/reception module 51 has a hermetically sealed structure in which members such as a coil constituting the transmission/reception module 51 and the like are integrally vacuum-sealed.

Figure 3:
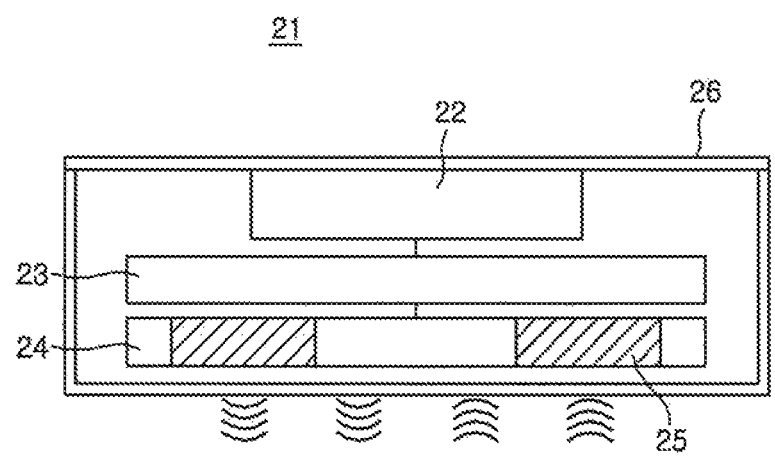
FIG. 3 shows an example of a sensor module.

The sensor module 21 is provided at the mounting table 2. The sensor module 21 is configured to transmit and receive various signals such as a sensor signal, a power signal and the like to and from the transmission/reception module 51 in a non-contact manner. FIG. 3 shows an example of the sensor module 21. As shown in FIG. 3, the sensor module 21 has a vacuum tube double structure including a temperature sensor 22, a circuit board 23, a coil 24, a ferrite core 25, and a housing 26.

The temperature sensor 22 measures a temperature of the mounting table 2, and may be, e.g., a diode sensor or a thermocouple. The circuit board 23 includes a circuit for transmitting and receiving various signals and components such as a capacitor and the like, and is electrically connected to the temperature sensor 22. The coil 24 transmits and receives various signals through high frequencies, resonance, microwaves, or the like to and from the coil of the transmission/reception module 51, and is electrically connected to the circuit board 23. The coil 24 and the ferrite core 25 transmit a sensor signal measured by, e.g., the temperature sensor 22, to the transmission/reception module 51, or receive a power signal supplied from the coil of the transmission/reception module 51. The housing 26 is made of a non-metal that does not suppress electromagnetic induction action, e.g., glass or the like.

The sensor module 21 has a hermetically sealed structure in which members such as the temperature sensor 22, the circuit board 23, the coil 24, the ferrite core 25 and the like constituting the sensor module 21 are integrally vacuum-sealed by the housing 26. Since the sensor module 21 has a hermetically sealed structure, it is possible to suppress warpage of the circuit board 23 due to a cryogenic heat input to the circuit board 23 and damages to a solder joint portion and also possible to obtain a grounding effect for suppressing external electrostatic influences. It is preferable to apply a functional thin metal film to the housing 26 of the sensor module 21. This makes it possible to suppress noise influences such as an electromagnetic field, static electricity or the like generated in the processing chamber 1. The functional thin metal film is a film having a magnetic shielding function, an electrostatic shielding function, an antistatic function or the like. The functional thin metal film may be, e.g., a nickel alloy-based film.

As described above, in the movable structure of the first configuration example, the temperature measured by the temperature sensor 22 of the sensor module 21 provided on the rotatable mounting table 2 can be transmitted to the transmission/reception module 51 provided in the freezing heat transfer body 5b. Therefore, even when a temperature difference occurs between the mounting table 2 and the freezing heat transfer body 5b, a measurement error due to a difference in the thermoelectromotive force does not occur. As a result, it is possible to accurately measure the temperature of the mounting table 2 that is a rotating body.

In the movable structure according to the embodiment, the sensor module 21 and the transmission/reception module 51 have a hermetically sealed structure. Therefore, it is possible to suppress noise influences such as electromagnetic field, static electricity and the like generated in the processing chamber 1 by suppressing the cryogenic heat input to the circuit board 23, the warpage of the circuit board 23, the damages to the solder joint portion, or by providing the grounding effect for suppressing the external electrostatic influences, the electrostatic shielding effect or the antistatic effect. As a result, measurement errors can be reduced, and a temperature of the mounting table 2 that is a rotating body can be accurately measured.

Further, in the movable structure according to the embodiment, the sensor module 21 and the transmission/reception module 51 perform transmission and reception of various signals in a non-contact manner. Therefore, there is no contamination caused by contact between a collector ring and a brush, which is the problem of a conventional slip ring, and the lifetime is prolonged. Since it is easy to disassemble or assemble the components, the time required for disassembling and assembling can be shortened. Further, even if a distance of the gap G1 (cooling gas passage) between the upper surface of the freezing heat transfer body 5b and the lower surface of the mounting table 2 is changed by expansion or contraction due to heat, the influence of disconnection or the like is eliminated and it is easy to deal with the change in the distance by adjusting the number of windings or the size of the coil.

Figure 4:
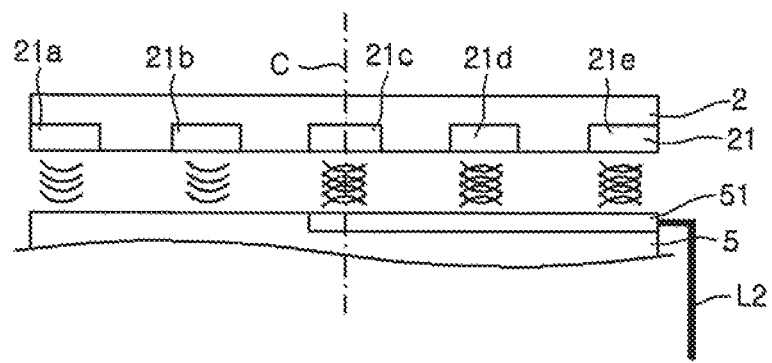
FIG. 4 is a schematic cross sectional view showing a second configuration example of the movable structure according to the embodiment.

Next, a second configuration example of the movable body structure according to the embodiment will be described. FIG. 4 is a schematic cross sectional view showing a second configuration example of the movable body structure according to the embodiment.

As shown in FIG. 4, the movable structure of the second configuration example is different from the movable structure of the first configuration example shown in FIG. 2 in that the freezing heat transfer member 5b of the cooling mechanism 5 is provided with one transmission/reception module 51 and the mounting table 2 is provided with a plurality of sensor modules 21.

The sensor module 21 is provided at a plurality of positions on the mounting table 2. In the illustrated example, the mounting table 2 is provided with a plurality of sensor modules 21a, 21b, 21c, 21d and 21e. Therefore, it is possible to measure temperatures at the plurality of positions on the surface of the mounting table 2. Accordingly, the temperature of the mounting table 2 can be controlled based on the temperatures at the plurality of positions on surface of the mounting table 2 and the in-plane uniformity of the temperature can be improved.

The transmission/reception module 51 is arranged to transmit and receive various signals such as a sensor signal, a power signal and the like to and from the plurality of sensor modules 21a, 21b, 21c, 21d and 21e. In the illustrated example, the transmission/reception module 51 is formed, e.g., in a rectangular shape, and extends outward from the center along a radial direction of the freezing heat transfer body 5b. The transmission/reception module 51 sequentially transmits and receives various signals to and from the plurality of sensor modules 21a, 21b, 21c, 21d and 21e as the mounting table 2 rotates. The illustrated example shows the positional relation between the sensor module 21 and the transmission/reception module 51 in a state where the sensor signal or the power signal can be transmitted and received between the transmission/reception module 51 and the sensor modules 21c, 21d and 21e.

Figure 5:
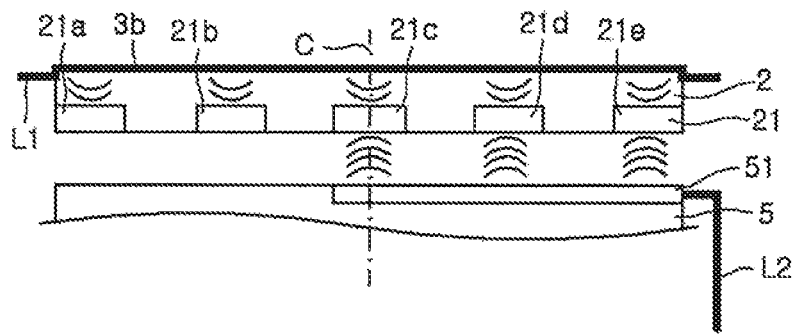
FIG. 5 is a schematic cross sectional view showing a third configuration example of the movable structure according to the embodiment.

Next, a third configuration example of the movable structure according to the embodiment will be described. FIG. 5 is a schematic cross sectional view showing the third configuration example of the movable structure according to the embodiment.

As shown in FIG. 5, the movable member structure of the third configuration example is different from the movable body of the second configuration example in that the electrode 3b of the electrostatic chuck 3 transmits a power signal in a non-contact manner to the sensor module 21.

The sensor module 21 has a coil capable of receiving a power signal in a non-contact manner from the electrode 3b of the electrostatic chuck 3. Therefore, even when the sensor module 21 cannot receive the power signal from the transmission/reception module 51 or even when the reception of the power signal is unstable, the power is supplied in a non-contact manner from the electrode 3b of the electrostatic chuck 3 to the sensor module 21. Accordingly, the power can be supplied stably.

In the above embodiments, the mounting table 2 is an example of the movable portion, and the freezing heat transfer body 5b is an example of the fixed portion.

While the embodiments for implementing the present disclosure have been described, the above contents do not limit the contents of the present disclosure, and various modifications and improvements can be made within the scope of the present disclosure.

In the above-described embodiments, the case in which the sensor module 21 includes the temperature sensor 22 has been described as an example. However, the sensor module 21 may include another sensor such as a displacement sensor or the like. When the sensor module 21 includes a displacement sensor, position information of the rotating body can be precisely measured in a non-contact manner by using the displacement sensor. The sensor may also be, e.g., a sensor for checking the presence/absence of objects (loads), a position (position meter)/displacement (differential transformer)/dimension sensor (encoder), a pressure/stress/distortion/torque/weight sensor (strain gauge, a pressure sensitive diode, load cell, a diaphragm, Bourdon tube, bellows), an angle sensor (resolver, encoder), a speed/rotational frequency sensor (ultrasonic, laser doppler or the like), an acceleration/vibration sensor (piezoelectric element, acceleration sensor), a temperature sensor (bimetal, thermocouple, resistance thermometer, thermistor or optical pyrometer), a magnetic sensor (magnetic needle, hall element, MR sensor or the like) and an optical sensor (photodiode/thyristor, photomultiplier tube, CCD image sensor or the like).

While the present disclosure has been shown and described with respect to the embodiments, it will be understood by those skilled in the art that various changes and modifications may be made without departing from the scope of the present disclosure as defined in the following claims.

What is claimed is:

1. A movable structure comprising:
   a processing chamber configured to perform processing under a vacuum environment;
   a fixed portion disposed in the processing chamber;
   a movable portion that is movable with respect to the fixed portion;
   a transmission/reception module provided at the fixed portion and having a hermetically sealed structure; and
   a sensor module provided at the movable portion and having a hermetically sealed structure,
   wherein the sensor module receives a power signal from the transmission/reception module in a non-contact manner,
   the transmission/reception module receives a sensor signal from the sensor module in a non-contact manner,
   the movable portion is a mounting table configured to mount thereon a substrate,
   the mounting table includes an electrostatic chuck, and
   power is supplied from an electrode of the electrostatic chuck to the sensor module in a non-contact manner when the sensor module cannot receive the power signal from the transmission/reception module or when reception of the power signal is unstable.

2. The movable structure of claim 1, wherein the fixed portion is provided with one transmission/reception module,
   the movable portion is provided with a plurality of sensor modules, and
   said one transmission/reception module transmits the power signal to at least one of the plurality of sensor modules and receives the sensor signal from at least one of the plurality of sensor modules.

3. The movable structure of claim 1, wherein the fixed portion includes a cooling mechanism configured to cool the mounting table.

4. The movable structure of claim 3, wherein the cooling mechanism cools the mounting table to a cryogenic temperature.

5. The movable structure of claim 3, wherein the cooling mechanism is arranged such that a center thereof coincides with a central axis that is a rotation center of the mounting table.

6. The movable structure of claim 3, wherein the cooling mechanism includes a freezer and a freezing heat transfer body provided on the freezer, and
   a cooling gas passage through which a cooling gas is supplied is provided between an upper surface of the freezing heat transfer body and a lower surface of the mounting table.

7. The movable structure of claim 1, wherein the sensor module includes a temperature sensor configured to measure a temperature of the movable portion.

8. The movable structure of claim 7, wherein the temperature sensor is a diode sensor.

9. The movable structure of claim 7, wherein the temperature sensor is a thermocouple.

10. A film forming apparatus comprising:
    a movable structure comprising:
        a processing chamber configured to perform processing under a vacuum environment,
        a fixed portion disposed in the processing chamber,
        a movable portion that is movable with respect to the fixed portion,
        a transmission/reception module provided at the fixed portion and having a hermetically sealed structure, and
        a sensor module provided at the movable portion and having a hermetically sealed structure,
        wherein the sensor module receives a power signal from the transmission/reception module in a non-contact manner,
        wherein the transmission/reception module receives a sensor signal from the sensor module in a non-contact manner,
        wherein the movable portion is a mounting table configured to mount thereon a substrate,
        wherein the mounting table includes an electrostatic chuck, and
        wherein power is supplied from an electrode of the electrostatic chuck to the sensor module in a non-contact manner when the sensor module cannot receive the power signal from the transmission/reception module or when reception of the power signal is unstable; and
    a target provided in the processing chamber.

* * * * *